United States Patent
Rajski et al.

(10) Patent No.: US 10,830,815 B2
(45) Date of Patent: Nov. 10, 2020

(54) SIGNAL PROBABILITY-BASED TEST CUBE REORDERING AND MERGING

(71) Applicant: Mentor Graphics Corporation, Wilsonville, OR (US)

(72) Inventors: Janusz Rajski, West Linn, OR (US); Yu Huang, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 18 days.

(21) Appl. No.: 16/360,691

(22) Filed: Mar. 21, 2019

(65) Prior Publication Data

US 2019/0293713 A1   Sep. 26, 2019

Related U.S. Application Data

(60) Provisional application No. 62/646,511, filed on Mar. 22, 2018.

(51) Int. Cl.
   *G01R 31/30*   (2006.01)
   *G01R 31/3177*  (2006.01)
   *G01R 31/317*   (2006.01)

(52) U.S. Cl.
   CPC ..... *G01R 31/3177* (2013.01); *G01R 31/3172* (2013.01)

(58) Field of Classification Search
   None
   See application file for complete search history.

(56) References Cited

U.S. PATENT DOCUMENTS

| | | | |
|---|---|---|---|
| 7,237,162 B1* | 6/2007 | Wohl | G01R 31/318547 714/726 |
| 2007/0038911 A1* | 2/2007 | Koenennann | G01R 31/31703 714/732 |
| 2007/0226570 A1* | 9/2007 | Zou | G01R 31/3177 714/741 |
| 2008/0235544 A1* | 9/2008 | Lai | G01R 31/318547 714/729 |
| 2009/0287438 A1* | 11/2009 | Cheng | G06F 11/2252 702/81 |

* cited by examiner

*Primary Examiner* — Mujtaba M Chaudry

(57) ABSTRACT

A first score and a second score for each scan cell are first determined based on numbers of test cubes in a set of test cubes having a specified value of "1" and a specified value of "0" for the each scan cell, respectively. A ranking score for each test cube in the set of test cubes is then determined based on combining the first scores and the second scores corresponding to specified bits of the each test cube in the set of test cubes. Test cubes in the set of test cubes are merged according to a sequence based on the ranking scores in a test pattern generation process.

12 Claims, 5 Drawing Sheets

SIGNAL PROBABILITY-BASED TEST CUBE REORDERING AND MERGING

RELATED APPLICATIONS

This application claims the benefit of U.S. Provisional Patent Application No. 62/646,511, filed on Mar. 22, 2018, titled "Signal Probability-Based Test Cube Reordering And Merging," and naming Janusz Raj ski et al. as inventors, which application is incorporated entirely herein by reference.

FIELD OF THE DISCLOSED TECHNIQUES

The presently disclosed techniques relates to circuit testing. Various implementations of the disclosed techniques may be particularly useful for increasing test compression ratio.

BACKGROUND OF THE DISCLOSED TECHNIQUES

Test application in chip manufacturing test is normally performed by a type of testers called expensive automatic test equipment (ATE). Scan-based tests consume significant amounts of storage and test time on ATE. As the technology node has advanced to below ten nanometers, the test data volume increases with the number of logic gates, the number of scan cells on the chip, and new defect types. Yet, practical considerations and ATE specifications often limit both the number of pins available for scan in/out and the maximum scan frequency. A few percentage of test time reduction can save multi-million dollars spent on testing for a semiconductor company producing millions of dies per day. It is highly desirable to reduce the amount of test data that need to be loaded onto ATE and ultimately to the circuit under test. Hardware-based test compression techniques such as embedded deterministic test (EDT) can take advantage of the fact that test cubes tend to be only specified with a small percentage of total scan cells to reduce the total test pattern count. A test cube is a deterministic test pattern in which the don't-care bits are not filled by ATPG. Meanwhile, ATPG itself can also reduce the total pattern count and test time by intelligent software-based fault reordering, cube reordering, and cube compaction techniques. When integrated together with hardware-based compression techniques, it can have amplified effects on reduction in test application time and data volume needed to be stored on ATE.

BRIEF SUMMARY OF THE DISCLOSED TECHNIQUES

Various aspects of the disclosed technology relate to generating test patterns based on test cube reordering. In one aspect, there is a method, executed by at least one processor of a computer, comprising: determining a first score and a second score for each scan cell based on numbers of test cubes in a set of test cubes having a specified value of "1" and a specified value of "0" for the each scan cell, respectively; determining a ranking score for each test cube in the set of test cubes based on combining the first scores and the second scores corresponding to specified bits of the each test cube in the set of test cubes; and generating test patterns, comprising: merging test cubes in the set of test cubes according to a sequence based on the ranking scores.

The first score and the second score may be a reciprocal of the number of test cubes in the set of test cubes having a specified value of "1" for the each scan cell and a reciprocal of the number of test cubes in the set of test cubes having a specified value of "0" for the each scan cell, respectively.

The ranking score may be a sum of the first scores and the second scores corresponding to the specified bits which is normalized by a number of the specified bits.

The generating test patterns may further comprise: ranking the set of test cubes according to the ranking scores; merging as many test cubes in the set of test cubes as possible based on the ranking to identify first test cubes and second test cubes, the first test cubes being test cubes that can be merged, and the second test cubes being test cubes that cannot be merged; ranking the first test cubes based on new ranking scores for the first test cubes, the new ranking scores determined based on the first scores and the second scores determined using the first test cubes; and performing incremental merging and compression checking on the ranked first test cubes to produce a merged test cube. The merging test cubes may further comprise: merging as many second test cubes into the merged test cube as possible to produce a final merged test cube, the final merged test cube passing the compression checking. The compression checking may be EDT encoding checking.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to generating test patterns based on test cube reordering. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "determine" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
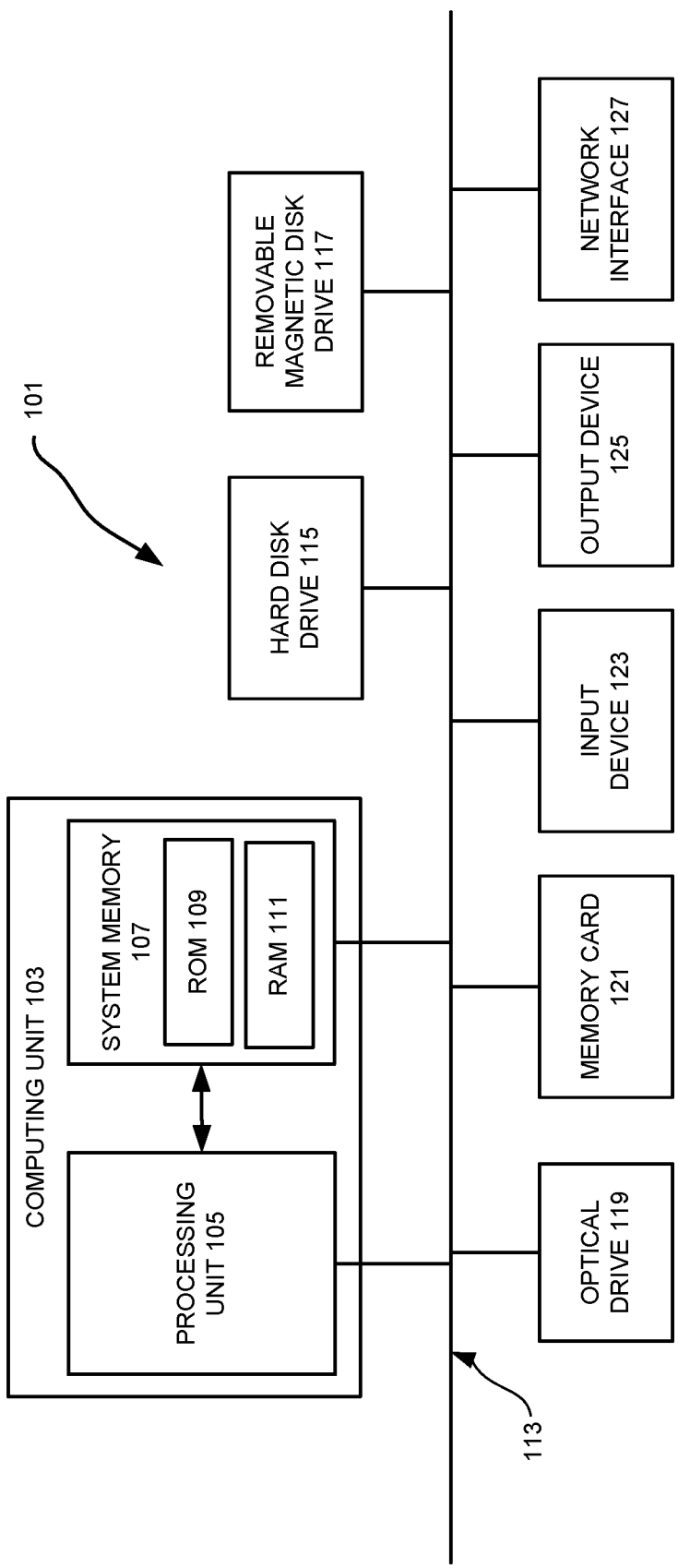
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, And Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Test Pattern Generation Tool

Figure 2:
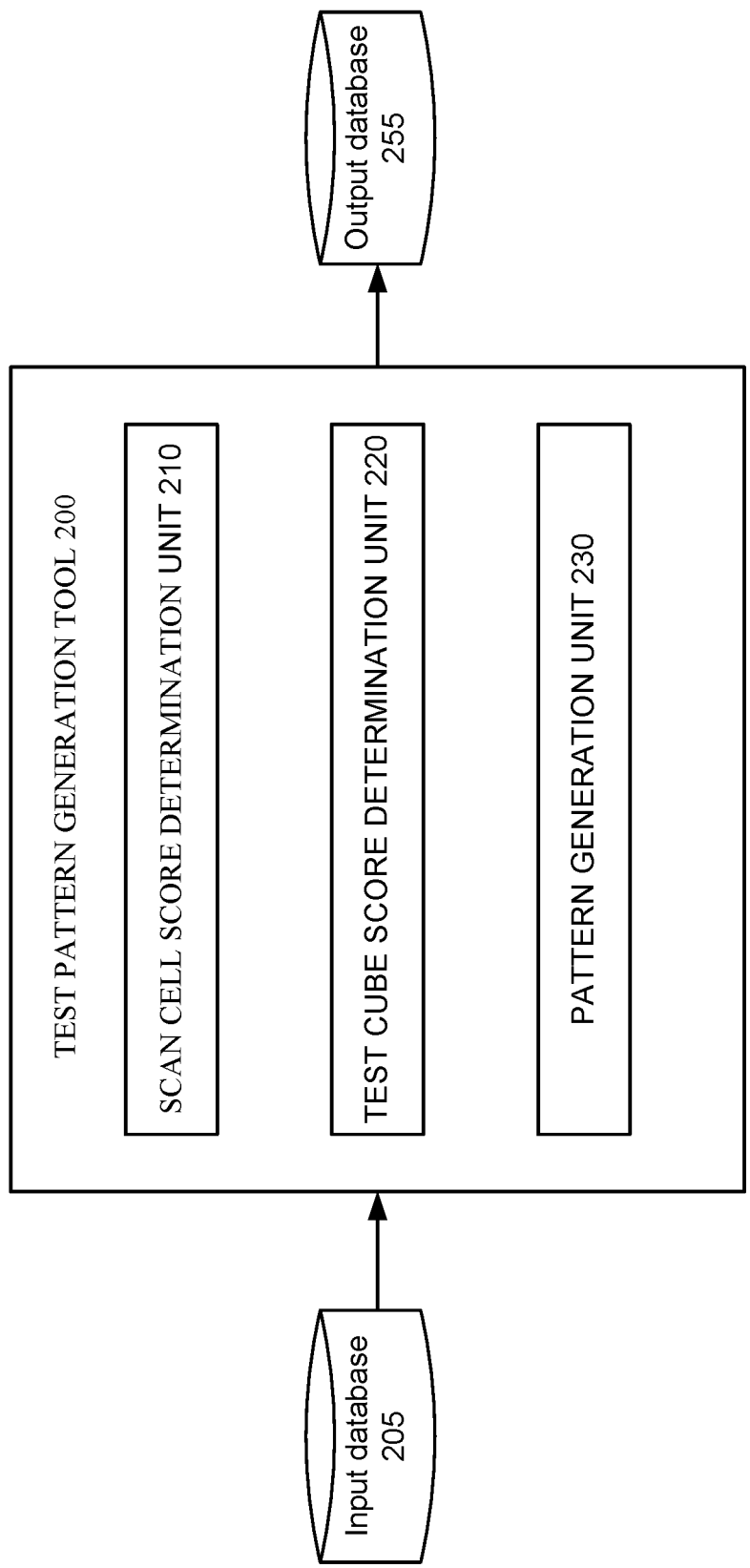
FIG. 2 illustrates an example of a test pattern generation tool that may be implemented according to various embodiments of the disclosed technology.

FIG. 2 illustrates an example of a test pattern generation tool 200 that may be implemented according to various embodiments of the disclosed technology. As seen in this figure, the test pattern generation tool 200 includes a scan cell score determination unit 210, a test cube score determination unit 220, and a pattern generation unit 230. Some implementations of the test pattern generation tool 200 may cooperate with (or incorporate) one or both of an input database 205 and an output database 255.

As will be discussed in more detail below, the scan cell score determination unit 210 determines a first score and a second score for each scan cell based on numbers of test cubes in a set of test cubes having a specified value of "1" and a specified value of "0" for the each scan cell, respectively. The set of test cubes may be received from the input database 205. The test cube score determination unit 220 determines a ranking score for each test cube in the set of test cubes based on combining the first scores and the second scores corresponding to specified bits of the each test cube in the set of test cubes. The pattern generation unit 230 generates test patterns, which comprises merging test cubes in the set of test cubes according to a sequence based on the ranking scores. The generated test patterns may be stored in the output database 255.

As previously noted, various examples of the disclosed technology may be implemented by one or more computing systems, such as the computing system illustrated in FIG. 1. Accordingly, one or more of the scan cell score determination unit 210, the test cube score determination unit 220, and the pattern generation unit 230 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the scan cell score determination unit 210, the test cube score determination unit 220, and the pattern generation unit 230. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the scan cell score determination unit 210, the test cube score determination unit 220, and the pattern generation unit 230 are shown as separate units in FIG. 2, a single computer (or a single processor within a master computer) or a single computer system may be used to implement some or all of these units at different times, or components of these units at different times.

With various examples of the disclosed technology, the input database 205 and the output database 255 may be implemented using any suitable computer readable storage device. That is, either of the input database 205 and the output database 255 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 205 and the output database 255 are shown as separate units in FIG. 2, a single data storage medium may be used to implement some or all of these databases.

Test Cube Reordering for Test Pattern Generation

Figure 3:
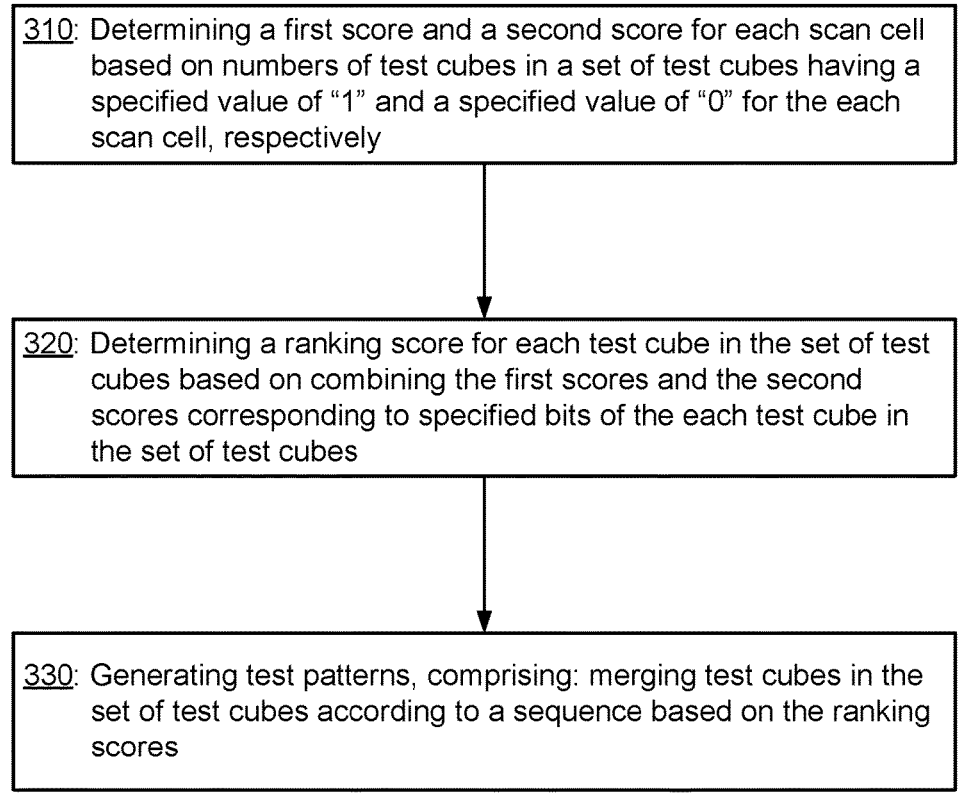
FIG. 3 illustrates a flowchart showing a process of test pattern generation based on test cube reordering that may be implemented according to various examples of the disclosed technology.

FIG. 3 illustrates a flowchart 300 showing a process of test pattern generation based on test cube reordering that may be implemented according to various examples of the disclosed technology. For ease of understanding, methods of test pattern generation based on test cube reordering that may be employed according to various embodiments of the disclosed technology will be described with reference to the test pattern generation tool 200 in FIG. 2 and the flow chart 300 illustrated in FIG. 3. It should be appreciated, however, that alternate implementations of a test pattern generation tool may be used to perform the methods of test pattern generation based on test cube reordering illustrated by the flow chart 300 according to various embodiments of the disclosed technology. Likewise, the test pattern generation tool 200 may be employed to perform other methods of test pattern generation based on test cube reordering according to various embodiments of the disclosed technology.

Figure 4:
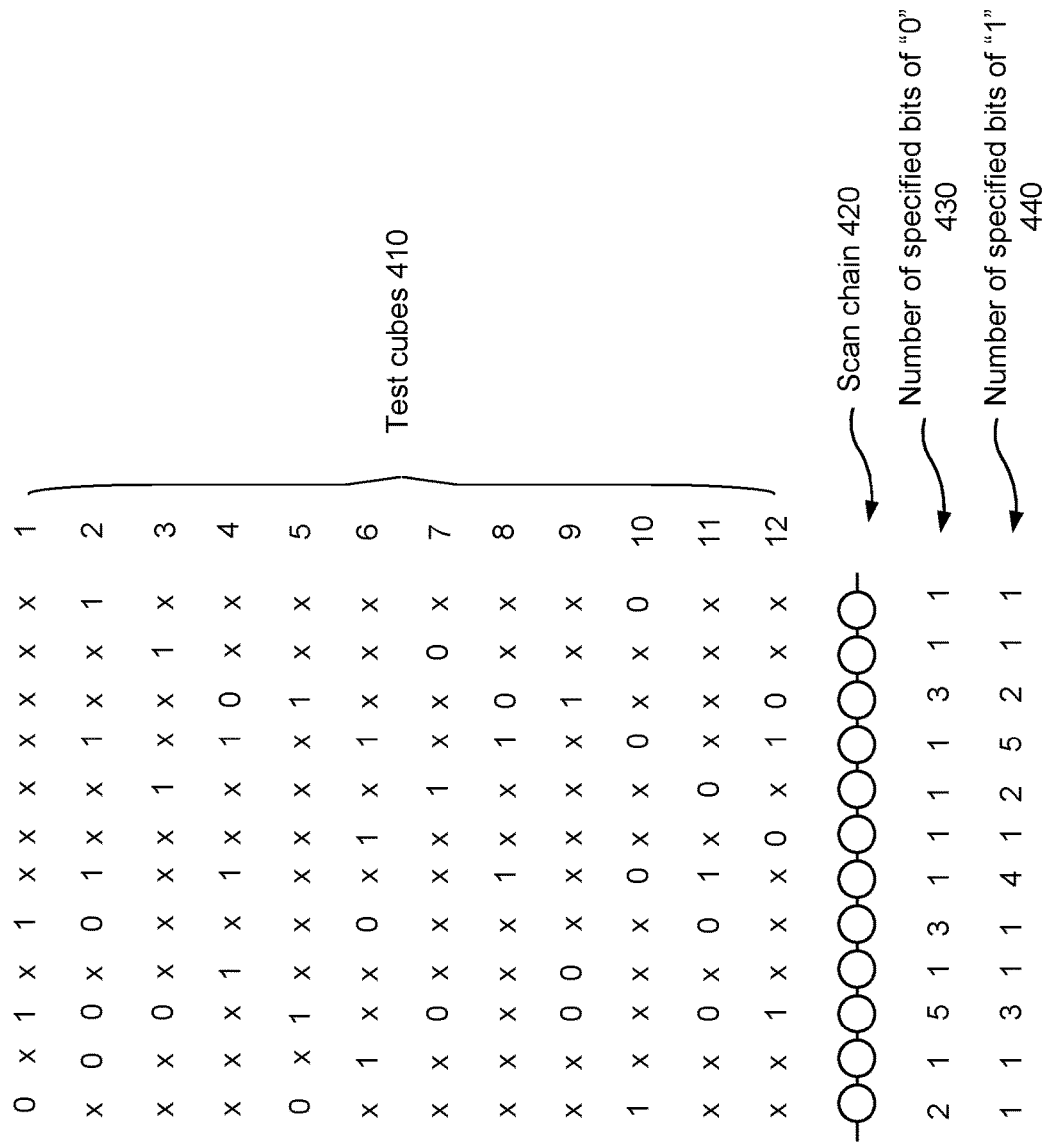
FIG. 4 illustrates an example for determining numbers of test cubes in a set of test cubes having a specified value of "1" and a specified value of "0".

In operation 310, the scan cell score determination unit 210 determines a first score and a second score for each scan cell based on numbers of test cubes in a set of test cubes having a specified value of "1" and a specified value of "0" for the each scan cell, respectively. The set of test cubes may be received from the input database 205 and may be generated a conventional ATPG tool for targeting a set of faults on a one-on-one basis. FIG. 4 illustrates an example for determining numbers of test cubes in a set of test cubes having a specified value of "1" and a specified value of "0". The set of test cubes 410 have 12 test cubes, aligning above a scan chain 420. Each test cube in the set of test cubes 410 has several specified bits of "1" and/or "0" with the rest being unspecified and represented by "x" (also called don't care bits). For the first scan cell on the left end of the scan chain, only the first and fifth test cubes in the set of test cubes 410 have a specified value of "0", and only the tenth test cube in the set of test cubes 410 has a specified value of "1". Therefore, the numbers of test cubes in a set of test cubes having a specified value of "1" and a specified value of "0" for the first scan cell are 1 and 2, respectively. The numbers of test cubes in a set of test cubes having a specified value of "1" and a specified value of "0" for the rest of the scan cells can be determined similarly. The results 430 and 440 are shown below the scan chain 420.

According to some embodiments of the disclosed technology, the first score $f_{i1}$ and the second score $f_{i0}$ for each scan cell can be computed according to Eqs. (1) and (2):

$$f_{i1} = 1/(\#\text{total cubes who set "1" at cell } i) \quad (1)$$

$$f_{i0} = 1/(\#\text{total cubes who set "0" at cell } i) \quad (2)$$

Alternatively, the first score and the second score may be set to directly equal the numbers of test cubes in a set of test cubes having a specified value of "1" and a specified value of "0", respectively. Other more complex formula may also be employed with various implementations of the disclosed technology.

In operation 320, the test cube score determination unit 220 determines a ranking score for each test cube in the set of test cubes based on combining the first scores and the second scores corresponding to specified bits of the each test cube in the set of test cubes. Assume the first scores and the second scores are represented by $f_{i1}$ and $f_{i0}$, respectively. Eq. (3) can be used to determine the ranking score s for each test cube in the set of test cubes:

$$s = \frac{\sum f_{i0} \text{ or } f_{i1} \text{ at } i^{th} \text{ specified bit/segment}}{\sum \text{specified bit/segment}} \quad (3)$$

Here, a segment means a set of consecutive bits having the same value. The ranking score s for a test cube measures how commonly its specified bits are used by other test cubes in the set of test cubes. If Eqs. (1) and (2) are used to determine the first scores and the second scores, then the smaller the ranking score s is, the more commonly the test cube's specified bits are used by other test cubes in the set of test cubes. Compare, for example, the ranking scores derived according to Eqs. (1), (2) and (3) for the tenth and eleventh test cubes in the test cubes 410 shown in FIG. 4.

$$S(10) = \frac{1+1+1+1}{4} = 1 \quad (4)$$

$$S(11) = \frac{1/5 + 1/3 + 1/4 + 1}{4} = 0.446 \quad (5)$$

Here, both of the tenth and eleventh test cubes have four specified bits. The ranking score for the eleventh test cube s(11) is smaller than that for the tenth test cube s(10) because three of its specified bits are used by several other test cubes in the test cubes 410.

In operation 330, the pattern generation unit 230 generates test patterns, which comprises merging test cubes in the set of test cubes according to a sequence based on the ranking scores. If the ranking scores are determined according to Eqs. (1), (2) and (3), the merging test cubes may start with the test cubes in the ascending order. This may allow more test cubes to be compacted into a single test cube because the test cubes with lower ranking scores share more specified bits.

Figure 5:
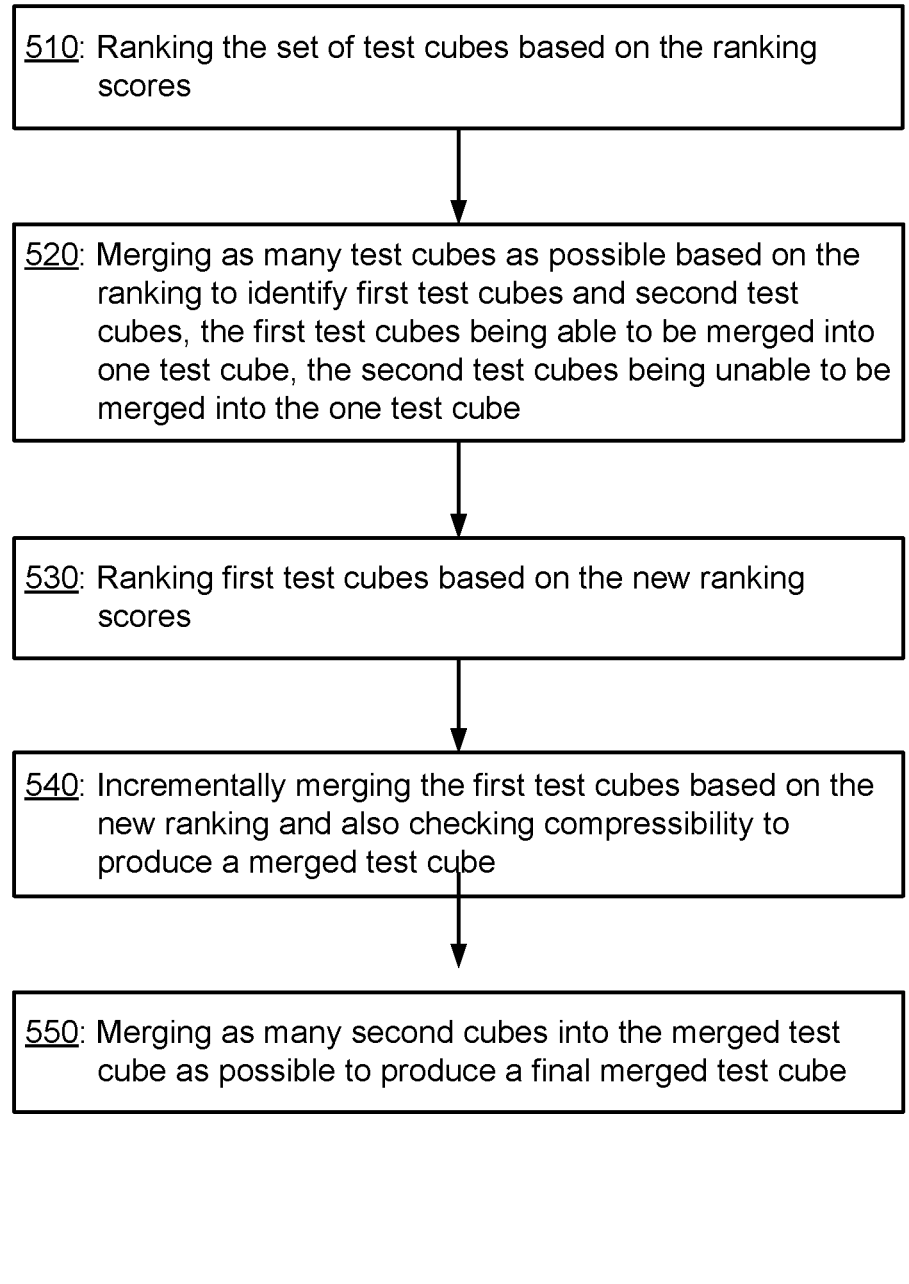
FIG. 5 illustrates an example of merging test cubes according to test cube reordering which may be implemented according to some examples of the disclosed technology.

FIG. 5 illustrates an example of merging test cubes according to test cube reordering which may be implemented according to some examples of the disclosed technology. In operation 510, the set of test cubes are ranked according to the ranking scores. In operation 520, the set of test cubes are merged as many as possible based on the ranking. For example, the first two test cubes are merged together if possible. Then the third one is checked to see if it can be merged into the above resultant test cube. If it cannot be merged, the fourth one is checked. The process goes on until all of the test cubes are checked. As a result, the set of test cubes is divided into two groups: the first test cubes which are test cubes that can be merged into a single test cubes and the second test cubes which are test cubes that cannot be merged into the single test cubes.

In operation 530, the first test cubes are ranked according to the new ranking scores. As the operation 310 of the flowchart 300 shows, the first and second scores and thus the ranking scores depend upon what test cubes for the ranking are. Therefore, the ranking score and the new ranking score for the same test cube are generally different because the first test cubes are a subset of the set of test cubes. Accordingly, the ranked first test cubes may be ranked differently according to the new ranking scores than the old ones.

In operation 540, the first test cubes are incrementally merged according to the new ranking order and the compressibility is incrementally checked to produce a merged test cube. This means that if two test cubes can be merged into an intermediately merged test cube, then the intermediately merged test cube is checked to see whether it can be compressed. In the case of EDT-related compression scheme, the intermediately merged test cube is checked to see whether it can be EDT-encoded. If the answer is yes, the next test cube is tried to be merged into the intermediately merged test cube and the resultant test cube is checked again for its compressibility. If the answer is no, the lower-ranked test cube is discarded and the next test cube is attempted to be merged into the higher-tanked test cube. The process is repeated until for example, all of the test cubes are checked.

In operation 550, as many the second test cubes as possible are merged into the merged test cube to produce a final merged test cube. The compressibility may be checked each time when one of the second test cubes can be merged.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
    determining a first score and a second score for each scan cell based on numbers of test cubes in a set of test cubes having a specified value of "1" and a specified value of "0" for the each scan cell, respectively;
    determining a ranking score for each test cube in the set of test cubes based on combining the first scores and the second scores corresponding to specified bits of the each test cube in the set of test cubes; and
    generating test patterns, comprising: merging test cubes in the set of test cubes according to a sequence based on the ranking scores.

2. The method recited in claim 1, wherein the first score and the second score are a reciprocal of the number of test cubes in the set of test cubes having a specified value of "1" for the each scan cell and a reciprocal of the number of test cubes in the set of test cubes having a specified value of "0" for the each scan cell, respectively.

3. The method recited in claim 1, wherein the ranking score is a sum of the first scores and the second scores corresponding to the specified bits which is normalized by a number of the specified bits.

4. The method recited in claim 1, wherein the merging test cubes comprises:
    ranking the set of test cubes according to the ranking scores;
    merging as many test cubes in the set of test cubes as possible based on the ranking to identify first test cubes and second test cubes, the first test cubes being test cubes that can be merged, and the second test cubes being test cubes that cannot be merged;
    ranking the first test cubes based on new ranking scores for the first test cubes, the new ranking scores determined based on the first scores and the second scores determined using the first test cubes; and
    performing incremental merging and compression checking on the ranked first test cubes to produce a merged test cube.

5. The method recited in claim 4, wherein the merging test cubes further comprises:
    merging as many second test cubes into the merged test cube as possible to produce a final merged test cube, the final merged test cube passing the compression checking.

6. The method recited in claim 4, wherein the compression checking is EDT encoding checking.

7. One or more non-transitory computer-readable media storing computer-executable instructions for causing one or more processors to perform a method, the method comprising:
    determining a first score and a second score for each scan cell based on numbers of test cubes in a set of test cubes having a specified value of "1" and a specified value of "0" for the each scan cell, respectively;
    determining a ranking score for each test cube in the set of test cubes based on combining the first scores and the second scores corresponding to specified bits of the each test cube in the set of test cubes; and
    generating test patterns, comprising: merging test cubes in the set of test cubes according to a sequence based on the ranking scores.

8. The one or more non-transitory computer-readable media recited in claim 7, wherein the first score and the second score are a reciprocal of the number of test cubes in the set of test cubes having a specified value of "1" for the each scan cell and a reciprocal of the number of test cubes in the set of test cubes having a specified value of "0" for the each scan cell, respectively.

9. The one or more non-transitory computer-readable media recited in claim 7, wherein the ranking score is a sum of the first scores and the second scores corresponding to the specified bits which is normalized by a number of the specified bits.

10. The one or more non-transitory computer-readable media recited in claim 7, wherein the merging test cubes comprises:
    ranking the set of test cubes according to the ranking scores;
    merging as many test cubes in the set of test cubes as possible based on the ranking to identify first test cubes and second test cubes, the first test cubes being test cubes that can be merged, and the second test cubes being test cubes that cannot be merged;
    ranking the first test cubes based on new ranking scores for the first test cubes, the new ranking scores determined based on the first scores and the second scores determined using the first test cubes; and
    performing incremental merging and compression checking on the ranked first test cubes to produce a merged test cube.

11. The one or more non-transitory computer-readable media recited in claim 10, wherein the merging test cubes further comprises:
    merging as many second test cubes into the merged test cube as possible to produce a final merged test cube, the final merged test cube passing the compression checking.

12. The one or more non-transitory computer-readable media recited in claim 10, wherein the compression checking is EDT encoding checking.

* * * * *